United States Patent
Lille

(10) Patent No.: US 10,381,411 B2
(45) Date of Patent: Aug. 13, 2019

(54) THREE-DIMENSIONAL MEMORY DEVICE CONTAINING CONFORMAL WRAP AROUND PHASE CHANGE MATERIAL AND METHOD OF MANUFACTURING THE SAME

(71) Applicant: SANDISK TECHNOLOGIES LLC, Plano, TX (US)

(72) Inventor: Jeffrey S. Lille, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/844,005

(22) Filed: Dec. 15, 2017

(65) Prior Publication Data
US 2019/0189688 A1    Jun. 20, 2019

(51) Int. Cl.
*H01L 27/24* (2006.01)
*H01L 45/00* (2006.01)

(52) U.S. Cl.
CPC ........ *H01L 27/249* (2013.01); *H01L 27/2427* (2013.01); *H01L 45/06* (2013.01); *H01L 45/1233* (2013.01); *H01L 45/1253* (2013.01); *H01L 45/143* (2013.01); *H01L 45/144* (2013.01); *H01L 45/148* (2013.01); *H01L 45/1608* (2013.01)

(58) Field of Classification Search
CPC combination set(s) only.
See application file for complete search history.

(56) References Cited

U.S. PATENT DOCUMENTS

| | | | |
|---|---|---|---|
| 8,345,472 B2 | 1/2013 | Lee et al. | |
| 8,349,681 B2 | 1/2013 | Alsmeier et al. | |
| 9,230,979 B1 | 1/2016 | Pachamuthu et al. | |
| 9,343,507 B2 | 5/2016 | Takaki | |
| 9,455,301 B2 * | 9/2016 | Ratnam | G11C 13/004 |
| 9,583,615 B2 | 2/2017 | Chen et al. | |
| 9,698,202 B2 | 7/2017 | Takaki | |
| 2008/0200003 A1 | 8/2008 | Hong et al. | |
| 2012/0147648 A1 | 6/2012 | Scheuerlein | |
| 2012/0155161 A1 * | 6/2012 | Lee | G11C 5/147 365/163 |
| 2013/0043455 A1 | 2/2013 | Bateman | |

(Continued)

FOREIGN PATENT DOCUMENTS

| WO | WO 2007-004843 A1 | 1/2007 |
|---|---|---|
| WO | WO 2015-138314 A1 | 9/2015 |

OTHER PUBLICATIONS

Kau, D.C. et al., "A Stackable Cross Point Phase Change Memory," IEEE, IEDM09, pp. 617-620, (2009).

(Continued)

*Primary Examiner* — Galina G Yushina
(74) *Attorney, Agent, or Firm* — The Marbury Law Group, PLLC

(57) ABSTRACT

A memory cell includes a first electrode which extends horizontally over a substrate, a layer stack containing a phase change memory material layer and a threshold switch material layer which wrap around the first electrode, and a second electrode which contains a first vertical portion and a second vertical portion which extend vertically over the substrate and are located on first and second lateral sides of the layer stack.

8 Claims, 15 Drawing Sheets

(56) References Cited

U.S. PATENT DOCUMENTS

| | | | |
|---|---|---|---|
| 2014/0061574 A1* | 3/2014 | Pio | H01L 27/10 257/5 |
| 2014/0061575 A1* | 3/2014 | Pio | H01L 27/10 257/5 |
| 2015/0263074 A1 | 9/2015 | Takaki | |
| 2016/0240665 A1 | 8/2016 | Chen et al. | |
| 2016/0260775 A1 | 9/2016 | Takaki | |
| 2018/0159032 A1* | 6/2018 | Park | H01L 45/1293 |
| 2018/0211703 A1* | 7/2018 | Choi | G11C 13/0038 |

OTHER PUBLICATIONS

Wong, H. S. P. et al., "Phase Change Memory," Proceedings of the IEEE, vol. 98, No. 12, pp. 2201-2227, (2010).

Xactix, Inc., "Isotropic Etching with Xenon Difluoride," https://wcam.engr.wisc.edu/Public/Reference/PlasmaEtch/XACTIX%20XeF2%20Presentaton.pdf, view date Dec. 11, 2017.

U.S. Appl. No. 15/478,637, filed Apr. 4, 2017, SanDisk Technologies LLC.

U.S. Appl. No. 15/637,357, filed Jun. 29, 2017, SanDisk Technologies LLC.

U.S. Appl. No. 15/672,929, filed Aug. 9, 2017, SanDisk Technologies LLC.

U.S. Appl. No. 15/843,777, filed Dec. 15, 2017, SanDisk Technologies LLC.

\* cited by examiner

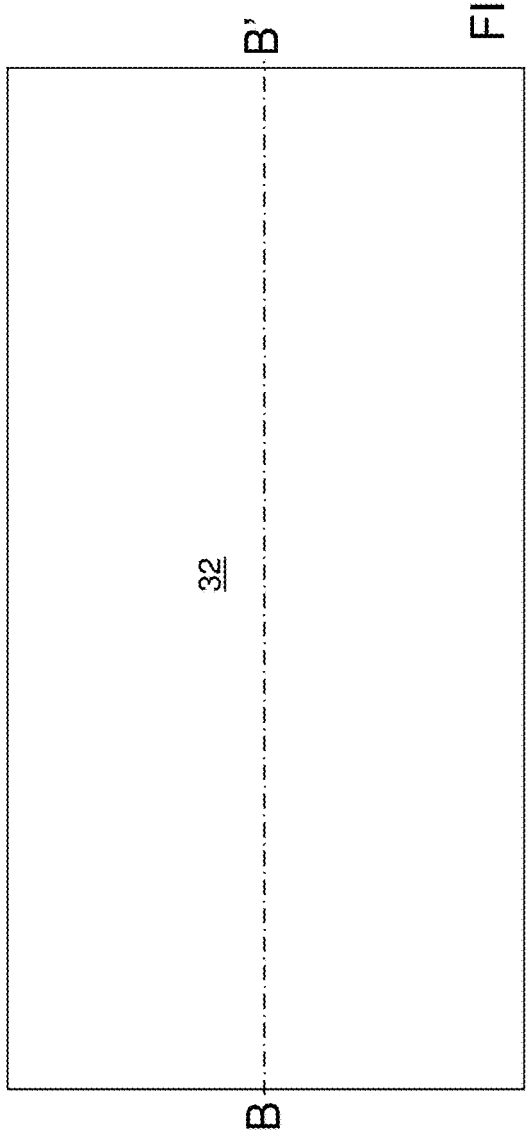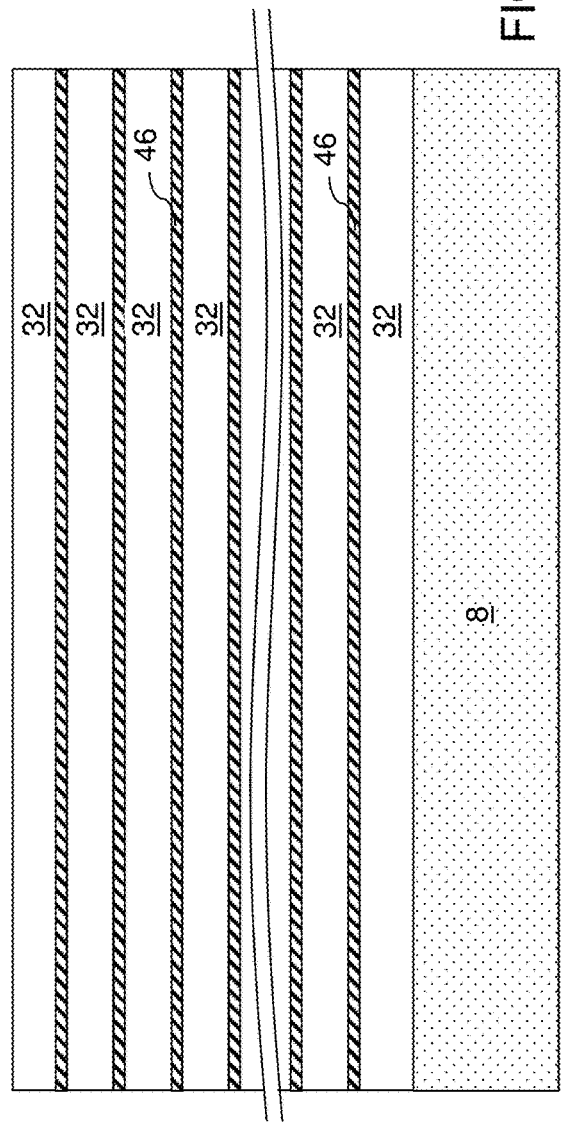

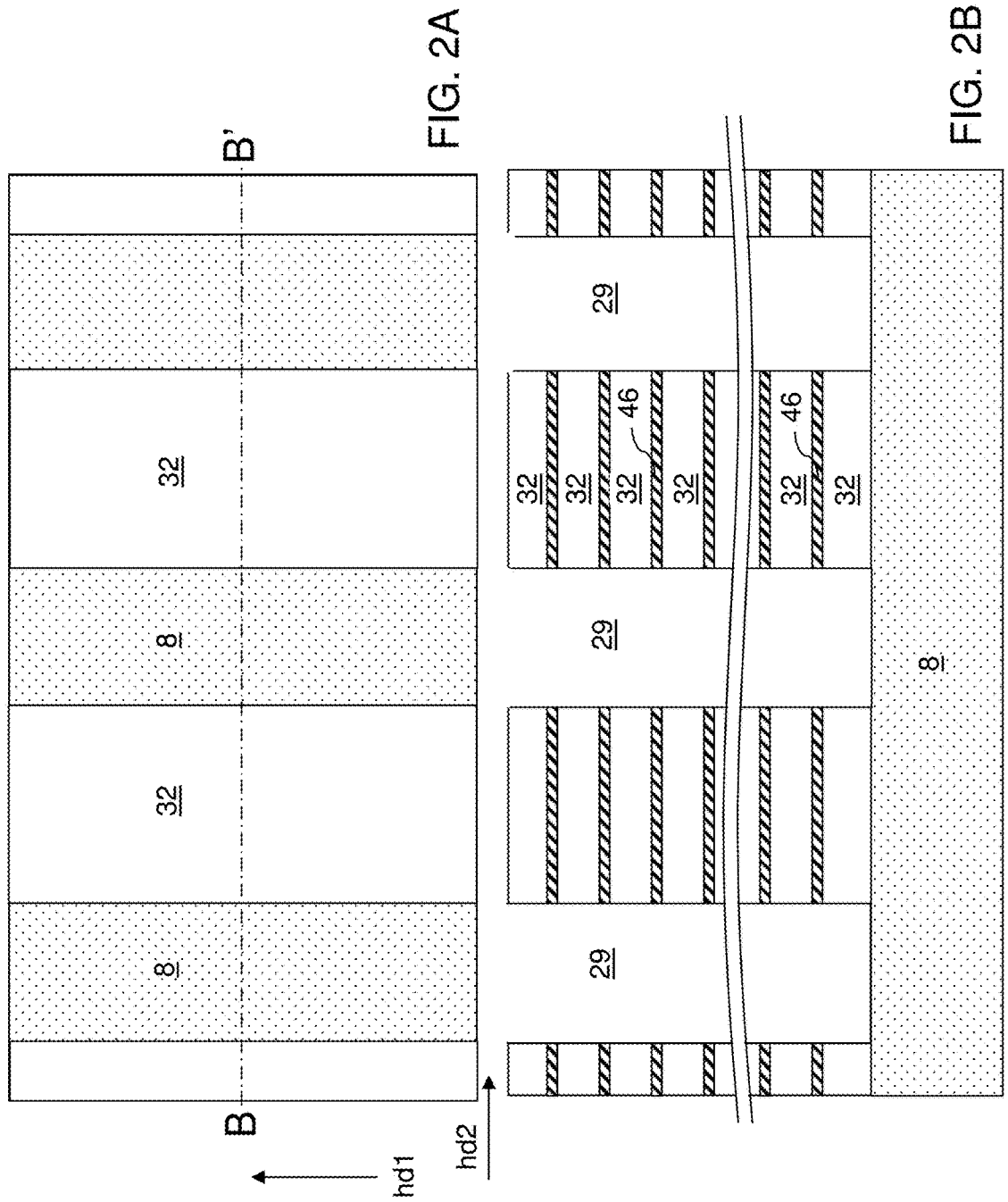

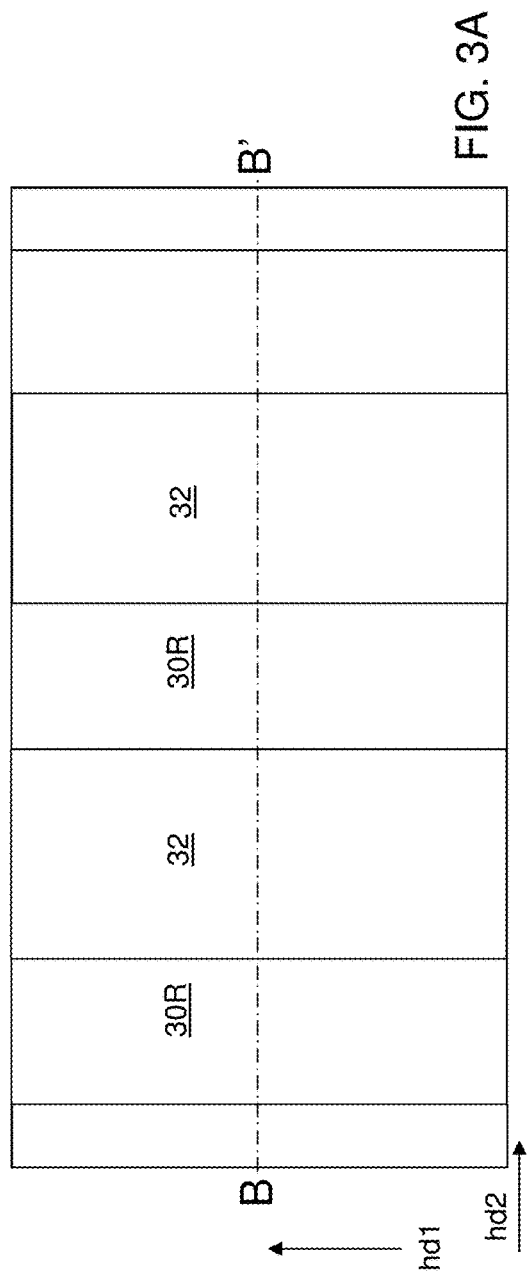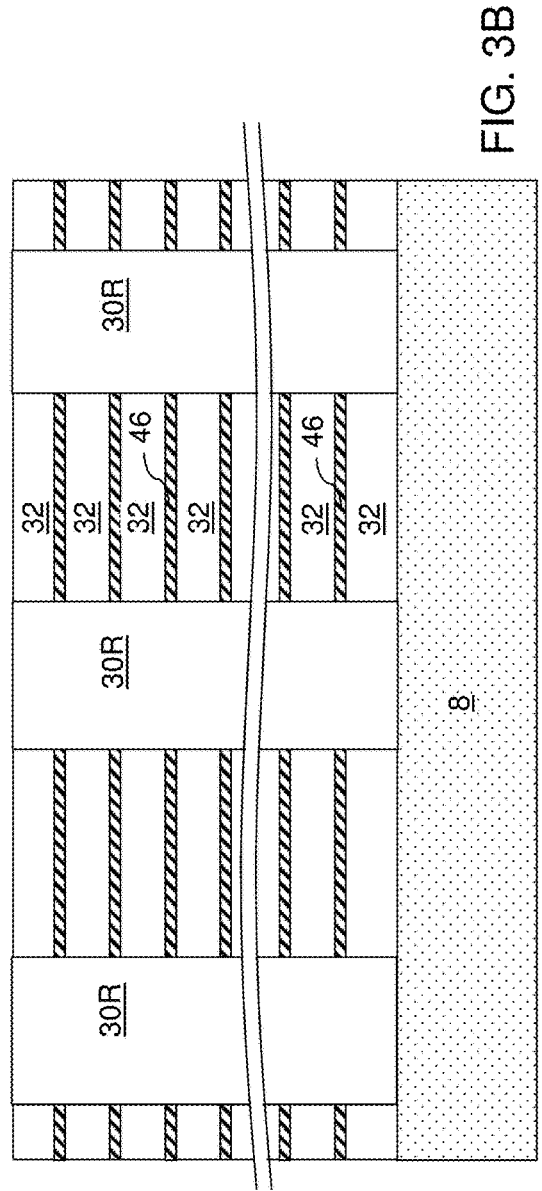

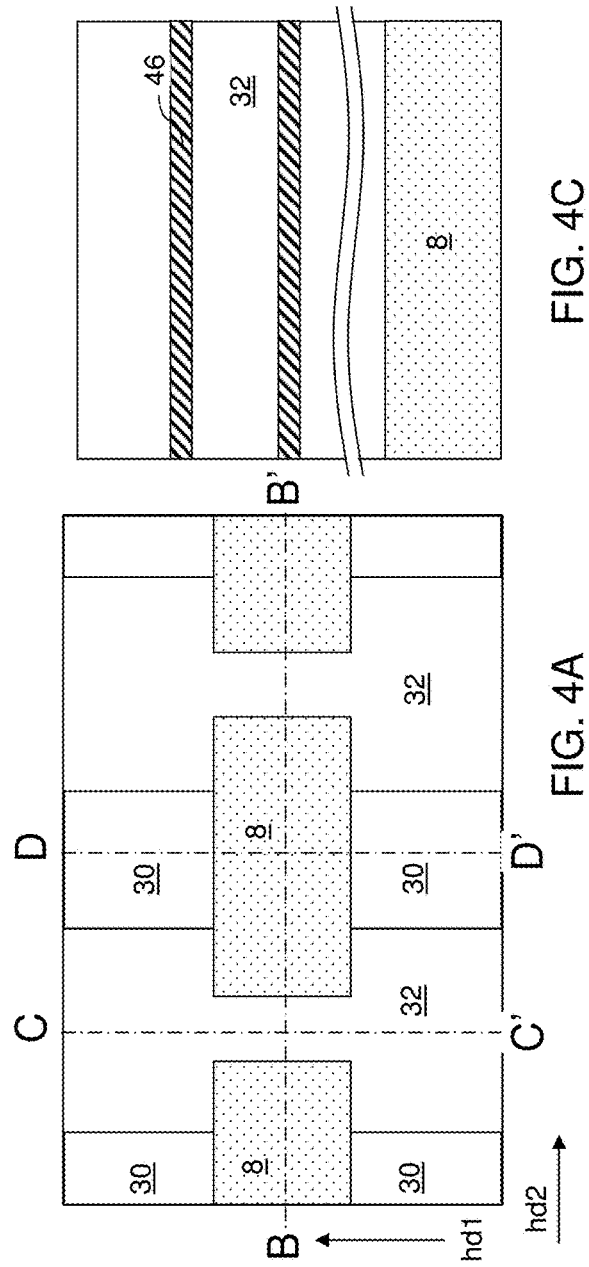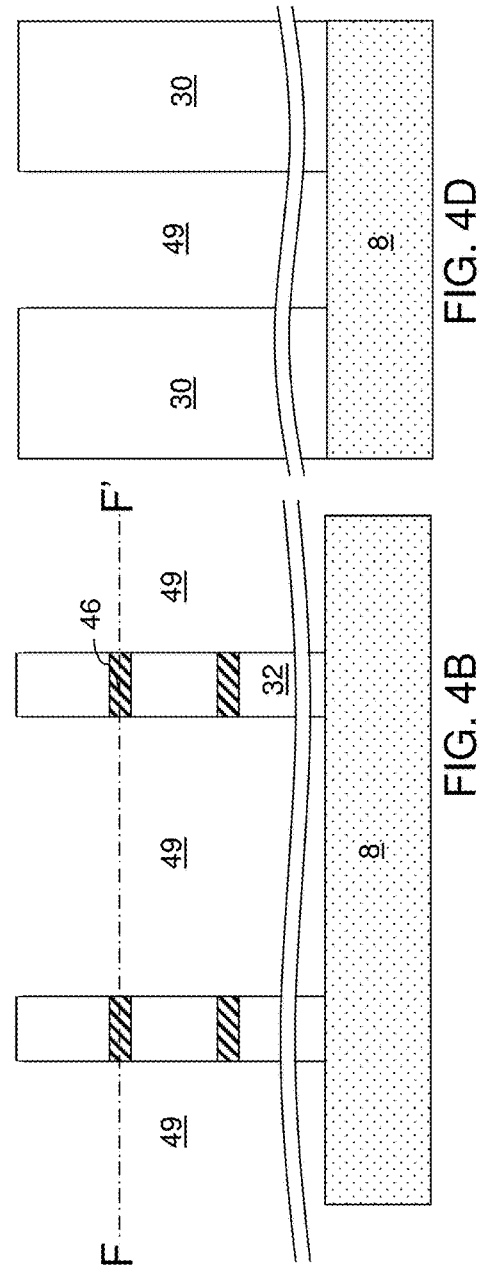

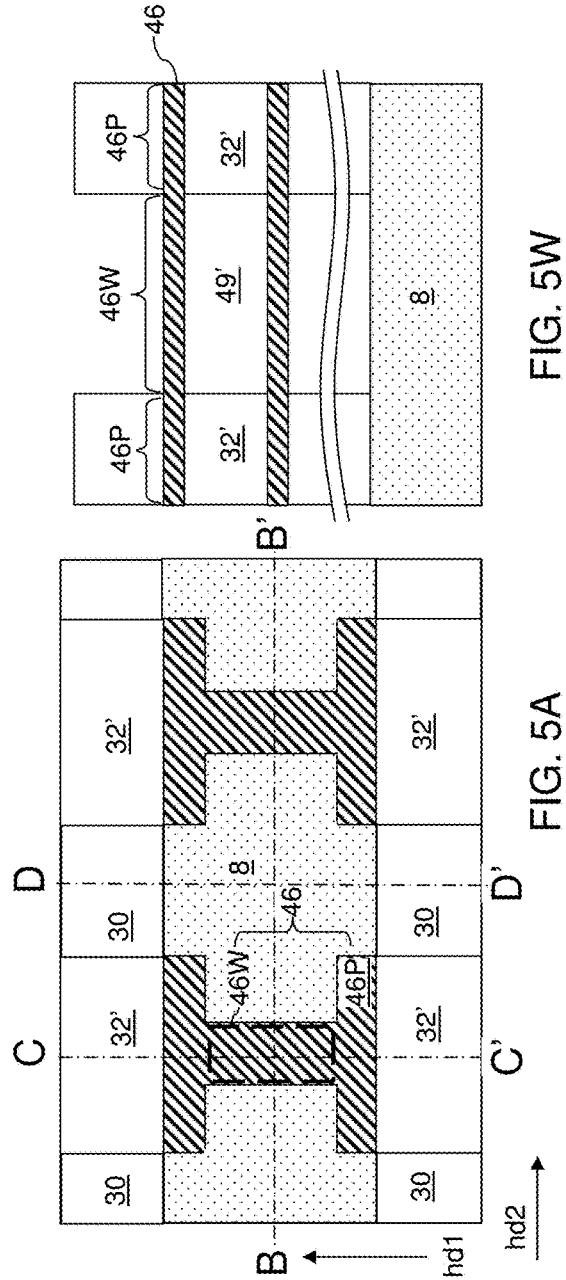
FIG. 5A
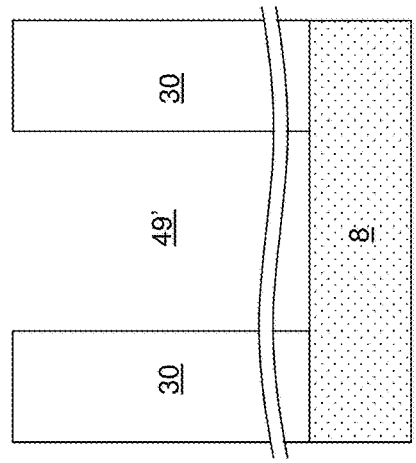
FIG. 5W
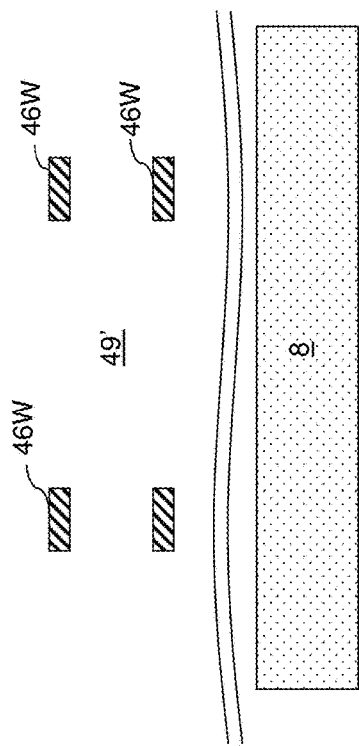
FIG. 5B
FIG. 5D

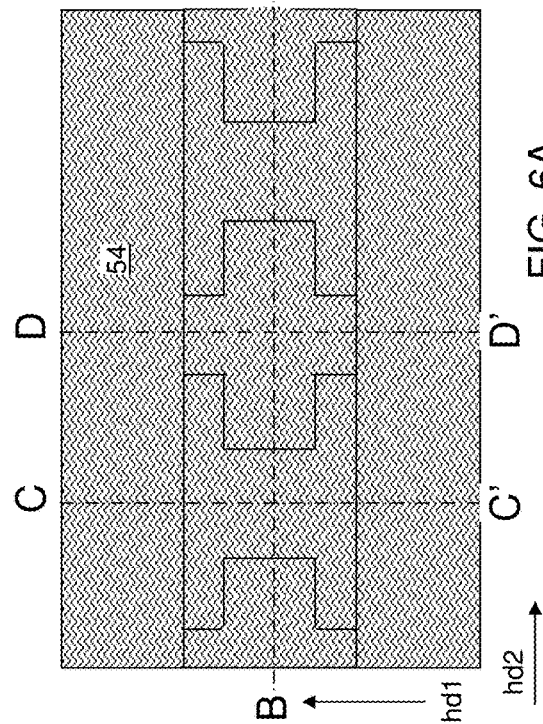
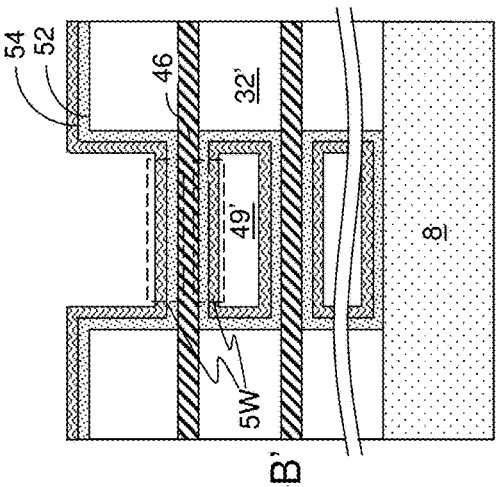
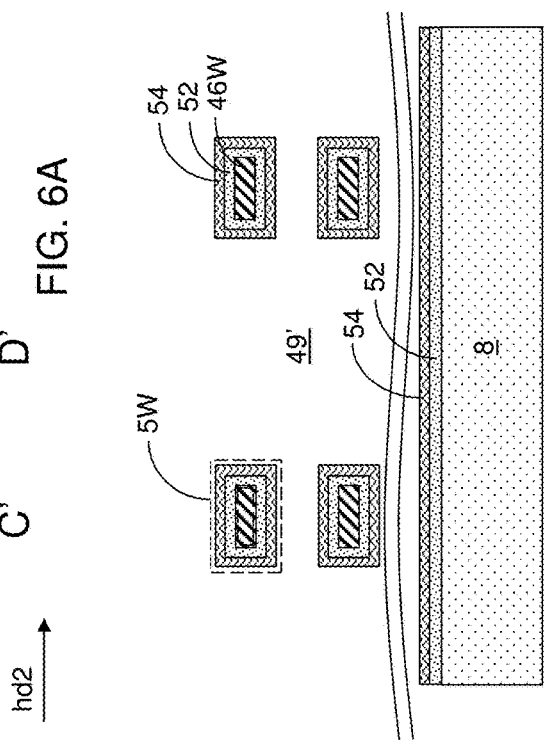
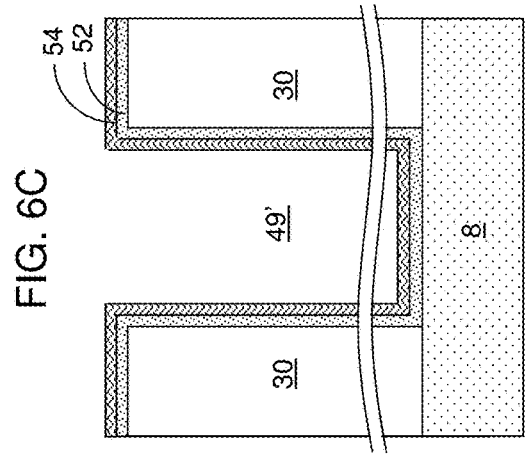

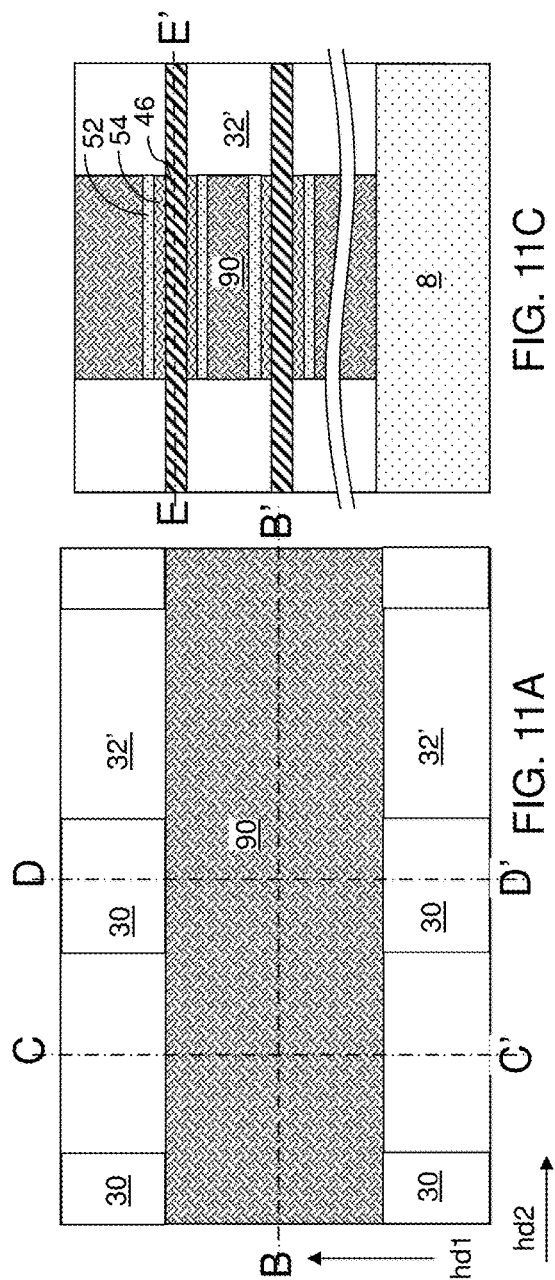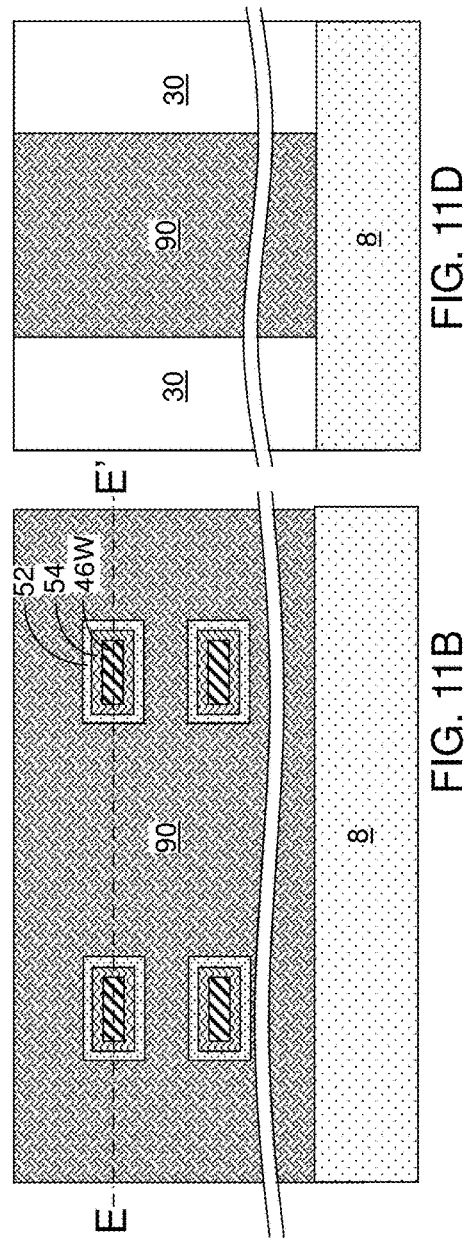

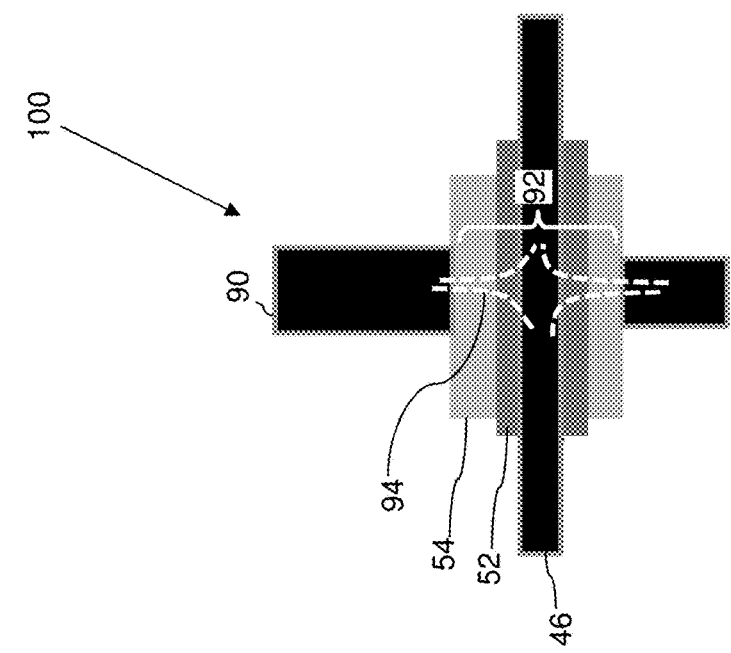
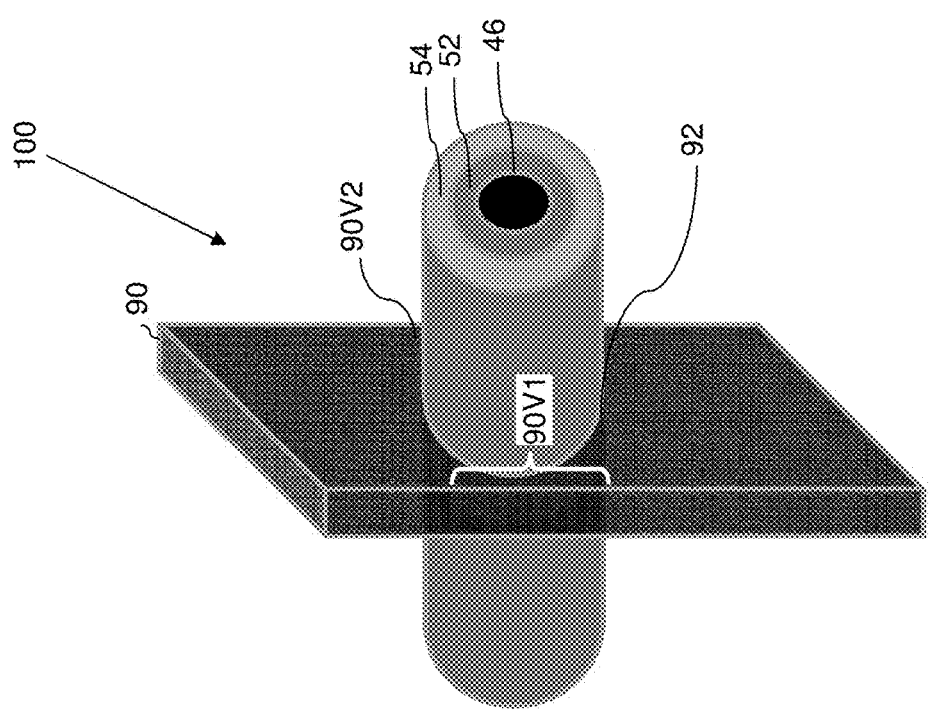
FIG. 12B
FIG. 12A

THREE-DIMENSIONAL MEMORY DEVICE CONTAINING CONFORMAL WRAP AROUND PHASE CHANGE MATERIAL AND METHOD OF MANUFACTURING THE SAME

FIELD

The present disclosure relates generally to the field of semiconductor devices and specifically to a three-dimensional phase change memory device and methods of manufacturing the same.

BACKGROUND

A phase change material (PCM) memory device is a type of non-volatile memory device that stores information as a resistive state of a material that can be in different resistive states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change memory material in a first part of a programming process. The second part of the programming process includes control of the cooling rate of the phase change memory material. If rapid quenching occurs, the phase change memory material can cool into an amorphous high resistivity state. If slow cooling occurs, the phase change memory material can cool into a crystalline low resistivity state.

SUMMARY

According to an aspect of the present disclosure, a memory cell includes a first electrode which extends horizontally over a substrate, a layer stack containing a phase change memory material layer and a threshold switch material layer which wrap around the first electrode, and a second electrode which contains a first vertical portion and a second vertical portion which extend vertically over the substrate and are located on first and second lateral sides of the layer stack.

According to another aspect of the present disclosure, a phase change memory device is provided, which comprises: word lines comprising electrically conductive layers that extend along a first horizontal direction and are laterally spaced apart along a vertical direction and along a second horizontal direction, wherein each of the electrically conductive layers comprises a laterally alternating plurality of pad portions and wire portions having a lesser width than the pad portions; a plurality of line trenches that laterally extend along the second horizontal direction and located between a neighboring pair of two-dimensional arrays of pad portions of the electrically conductive layers such that a respective two-dimensional array of wire portions traverses each of the plurality of line trenches; layer stacks of a phase change memory material layer and a threshold switch material layer located within a respective one of the plurality of line trenches, wherein each of the layer stacks includes a respective two-dimensional array of wrap around portions, and each wrap around portion within the respective two-dimensional array of wrap around portions surrounds a respective one of the wire portions of the electrically conductive layers and includes a respective phase change memory material wrap around portion and a respective threshold switch material wrap around portion; and a plurality of bit lines located within a respective one of the plurality of line trenches, wherein each wrap around portion of the layer stacks is surrounded by a respective one of the plurality of bit lines within a vertical plane that is perpendicular to the first horizontal direction.

According to another aspect of the present disclosure, a method of forming a phase change memory device is provided, which comprises the steps of: forming a one-dimensional array of alternating vertical stacks of insulating layers and electrically conductive layers over a substrate, wherein each of the insulating layers and the electrically conductive layers laterally extend along a first horizontal direction, and the alternating vertical stacks are laterally spaced among one another along a second horizontal direction; patterning each of the electrically conductive layers into a laterally alternating plurality of pad portions and wire portions having a lesser width than the pad portions; forming layer stacks of a phase change memory material layer and an ovonic threshold switch material layer around the wire portions, wherein each of the layer stacks includes a respective two-dimensional array of wrap around portions, and each wrap around portion within the respective two-dimensional array of wrap around portions surrounds a respective one of the wire portions of the electrically conductive layers and includes a respective phase change memory material wrap around portion and a respective ovonic threshold switch material wrap around portion; and forming a plurality of bit lines, wherein each wrap around portion of the layer stacks is surrounded by a respective one of the plurality of bit lines within a vertical plane that is perpendicular to the first horizontal direction.

BRIEF DESCRIPTION OF THE DRAWINGS

FIG. 1A is a top-down view of an exemplary structure after formation of an alternating stack of insulating layers and electrically conductive layers according to an embodiment of the present disclosure.

FIG. 1B is a vertical cross-sectional view of the exemplary structure along the vertical plane B-B' of FIG. 1A.

FIG. 2A is a top-down view of the exemplary structure after formation of a one-dimensional array of alternating vertical stacks of insulating layers and electrically conductive layers that are laterally spaced among one another by line trenches extending along a first horizontal direction according to an embodiment of the present disclosure.

FIG. 2B is a vertical cross-sectional view of the exemplary structure along the vertical plane B-B' of FIG. 2A.

FIG. 3A is a top-down view of the exemplary structure after formation of dielectric rails in the line trenches according to an embodiment of the present disclosure.

FIG. 3B is a vertical cross-sectional view of the exemplary structure along the vertical plane B-B' of FIG. 3A.

FIG. 4A is a top-down view of the exemplary structure after formation of a two-dimensional array of openings extending through the one-dimensional array of alternating vertical stacks and the dielectric rail structures according to an embodiment of the present disclosure.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 4D is a vertical cross-sectional view of the exemplary structure along the vertical plane D-D' of FIG. 4A.

FIG. 5A is a top-down view of the exemplary structure after isotropically etching the insulating layers to merge openings along a second horizontal direction according to an embodiment of the present disclosure.

FIG. 5B is a vertical cross-sectional view of the exemplary structure along the vertical plane B-B' of FIG. 5A.

FIG. 5W is a vertical cross-sectional view of the exemplary structure along the vertical plane C-C' of FIG. 5A.

FIG. 5D is a vertical cross-sectional view of the exemplary structure along the vertical plane D-D' of FIG. 5A.

FIG. 6A is a top-down view of the exemplary structure after forming a layer stack of a phase change memory material layer and an ovonic threshold switch material layer around wire portions of the electrically conductive layers according to an embodiment of the present disclosure.

FIG. 6B is a vertical cross-sectional view of the exemplary structure along the vertical plane B-B' of FIG. 6A.

FIG. 6C is a vertical cross-sectional view of the exemplary structure along the vertical plane C-C' of FIG. 6A.

FIG. 6D is a vertical cross-sectional view of the exemplary structure along the vertical plane D-D' of FIG. 6A.

FIG. 11A is a top-down view of a third alternative embodiment of the exemplary structure according to an embodiment of the present disclosure.

FIG. 11B is a vertical cross-sectional view of the exemplary structure along the vertical plane B-B' of FIG. 11A.

FIG. 11C is a vertical cross-sectional view of the exemplary structure along the vertical plane C-C' of FIG. 11A.

FIG. 11D is a vertical cross-sectional view of the exemplary structure along the vertical plane D-D' of FIG. 11A.

FIGS. 12A and 12B are respective schematic plan and vertical cross sectional views of one memory cell of the exemplary structure of FIGS. 8A to 8E.

DETAILED DESCRIPTION

Figure 4E:
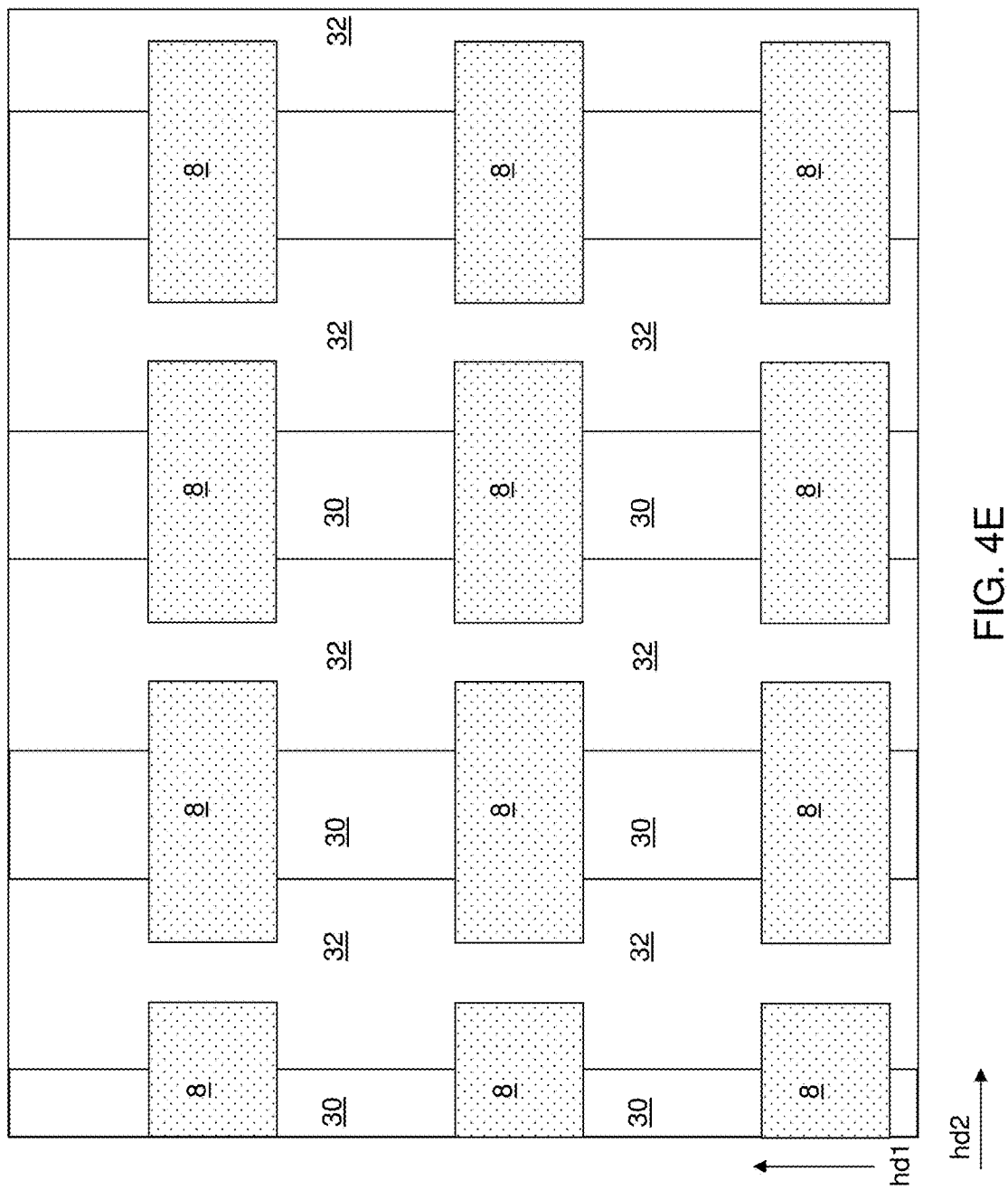
FIG. 4E is another top-down view of the exemplary structure over a larger area that includes the area of the top-down view of FIG. 4A.

The embodiments of the present disclosure provide PCM memory device having a PCM and a threshold switch conformally wrapped around horizontal word lines. The PCM and threshold switch may have a ring shape or tubular shape (which is not necessarily cylindrical). The embodiments of the present disclosure provide a high density, three-dimensional PCM memory array in which multiple PCM memory devices are arranged in an array configuration that allows selection of each individual PCM memory device for data storage and data retrieval. Further, the volume of each PCM portion is preferably minimized with sufficient thermal insulation for the PCM portion to provide efficient programming of each PCM cell without consuming excessive electrical power for programming. Thus, a PCM memory device design of embodiments of the present disclosure can reduce the volume of a unit cell and provide efficient programming with small programming current.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with a same reference numeral refer to a same element or similar elements, and are presumed to have the same composition thereamongst unless otherwise specified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Referring to FIGS. 1A and 1B, an exemplary structure for forming a phase change material memory device according to an embodiment of the present disclosure is illustrated, which includes a substrate 8 and an alternating stack of insulating layers 32 and electrically conductive layers 46. The substrate 8 can include an insulating material, a conductive material, and/or a semiconducting material. In one embodiment, the substrate 8 can include a semiconductor substrate (such as a semiconductor wafer, for example a silicon wafer), semiconductor devices (not shown), such as driver circuit transistors formed thereupon, and/or metal interconnect structures that provide interconnection among the semiconductor devices.

As used herein, an "alternating stack" refers to a stack of first elements and second elements that is arranged such that the first elements and the second elements alternate along the direction of the stack. The insulating layers 32 include an insulating material, and the electrically conductive layers 46 include an electrically conductive material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. Electrically conductive materials that can be employed for the electrically conductive layers 46 include, but are not limited to, an elemental metal, in intermetallic alloy of at least two elemental metals, a conductive alloy of at least one metal and at least one non-metallic element (such as a conductive metal nitride or a metal silicide), and a conductive doped semiconductor material. For example, the electrically conductive layers 46 may comprise titanium nitride and/or tungsten.

An insulating layer 32 and an electrically conductive layer 46 can constitute a unit of repetition in the alternating stack (32, 46). The total number of repetitions in the alternating stack (32, 46) can be in a range from 4 to 1,024, such as from 8 to 256, although lesser and greater numbers of repetition can also be employed. The thickness of each insulating layer 32 can be in a range from 15 nm to 60 nm, and the thickness of each electrically conductive layer 46 can be in a range from 15 nm to 60 nm, although lesser and greater thicknesses can also be employed for each of the insulating layers 32 and the electrically conductive layers 46.

Referring to FIGS. 2A and 2B, line trenches 29 are formed through the alternating stack (32, 46) of the insulating layers 32 and the electrically conductive layers 46. The line trenches 29 vertically extend through each of the layers in the alternating stack (32, 46) to a bottom most layer of the alternating stack, such as to the top surface of the substrate 8 so that at least one sidewall of each electrically conductive layer 46 is physically exposed around each of the openings. The line trenches 29 laterally extend along a first horizontal direction hd1 (e.g., the word line direction), and are laterally spaced apart among one another along a second horizontal direction hd2 (e.g., the bit line direction) that is perpendicular to the first horizontal direction hd1. Each of the liner trenches 29 can have a respective uniform width along a widthwise direction, i.e., along the second horizontal direction. The width of each line trench 29 can be, for example, in a range from 25 nm to 500 nm, such as from 50 nm to 250 nm, although lesser and greater widths can also be employed.

The alternating stack of insulating layers 32 and electrically conductive layers 46 is divided into a plurality of alternating vertical stacks of insulating layers 32 and electrically conductive layers 46 by the line trenches 29. A one-dimensional array of alternating vertical stacks of insulating layers 32 and electrically conductive layers 46 is formed such that alternating vertical stacks (32, 46) are laterally spaced among one another by the line trenches 29 extending along the first horizontal direction hd1. Each of the insulating layers 32 and the electrically conductive layers 46 in the alternating vertical stacks (32, 46) can laterally extend along the first horizontal direction hd1, and can have a respective uniform width along the second horizontal direction hd2. The alternating vertical stacks (32, 46) are laterally spaced among one another along the second horizontal direction hd2.

Referring to FIGS. 3A and 3B, a dielectric material is deposited in the line trenches 29 by a conformal deposition process such as chemical vapor deposition or spin-on deposition. The dielectric material can be a planarizable material such as doped silicate glass, undoped silicate glass, organosilicate glass, spin-on glass (SOG), or a combination thereof.

Optionally, a dielectric liner (not expressly illustrated), such as silicon nitride liner, may be deposited prior to depositing the dielectric material. The duration of the conformal deposition process can be selected such that each line trench 29 is completely filled with the dielectric material. Optionally, a reflow process may be performed to remove voids, if present, within the portions of the dielectric material that are deposited in the line trenches 29.

Excess portions of the dielectric material deposited above the horizontal plane including the topmost surfaces of the vertically alternating stacks (32, 46) can be removed by a planarization process. The planarization process can include a recess etch process and/or chemical mechanical planarization. If a recess etch process is employed, the recess etch process can include an isotropic etch process such as a wet etch process and/or an anisotropic etch process such as a reactive ion etch process. Each remaining portion of the deposited dielectric material in the line trenches 29 constitutes a dielectric rail structure 30R. The dielectric rail structures 30R can have a respective vertical cross-sectional view along directions perpendicular to the first horizontal direction hd1 that is invariant under translation along the first horizontal direction hd1. The dielectric rail structures 30R can form a one-dimensional array that is repeated along the second horizontal direction hd2 with a same periodicity. The top surfaces of the dielectric rail structures 30R can be within a same horizontal plane as top surfaces of the vertically alternating stacks (32, 46).

Referring to FIGS. 4A-4F, a two-dimensional array of openings 49 can be formed through the one-dimensional array of alternating vertical stacks (32, 46) and the dielectric rail structures 30R. The openings 49 can be formed, for example, by applying a photoresist layer (not shown) over the top surfaces of the one-dimensional array of alternating vertical stacks (32, 46) and the dielectric rail structures 30R, lithographically patterning the photoresist layer to form an array of openings in the photoresist layer, and by transferring the pattern in the photoresist layer by performing an anisotropic etch process in which the pattern in the photoresist layer is transferred through the one-dimensional array of alternating vertical stacks (32, 46) and the dielectric rail structures 30R. The photoresist layer can be subsequently removed, for example, by ashing.

Each of the electrically conductive layers 46 is patterned to include a respective laterally alternating plurality of pad portions 46P and wire portions 46W. The lateral dimensions of the openings 49 through the one-dimensional array of alternating vertical stacks (32, 46) and the dielectric rail structures 30R, as measured along the second horizontal direction hd2, can be greater than the width of the dielectric rail structures 30R along the second horizontal direction hd2. In one embodiment, the dielectric rail structures 30R can be provided as a periodic one-dimensional array having a pitch along the second horizontal direction hd2, and the vertically alternating stacks (32, 46) can be provided as another periodic one-dimensional array having the same pitch as the periodic one-dimensional array of dielectric rail structures 30R along the second horizontal direction hd2. In this case, the openings 49 can be formed as a periodic two-dimensional array of openings 49 having the same pitch as the pitch of the vertically alternating stacks (32, 46) along the second horizontal direction hd2. The openings 49 can be periodic along the first horizontal direction hd1 with another pitch, which may be the same as, or different from, the pitch of the vertically alternating stacks (32, 46) along the second horizontal direction hd2.

Figure 4F:
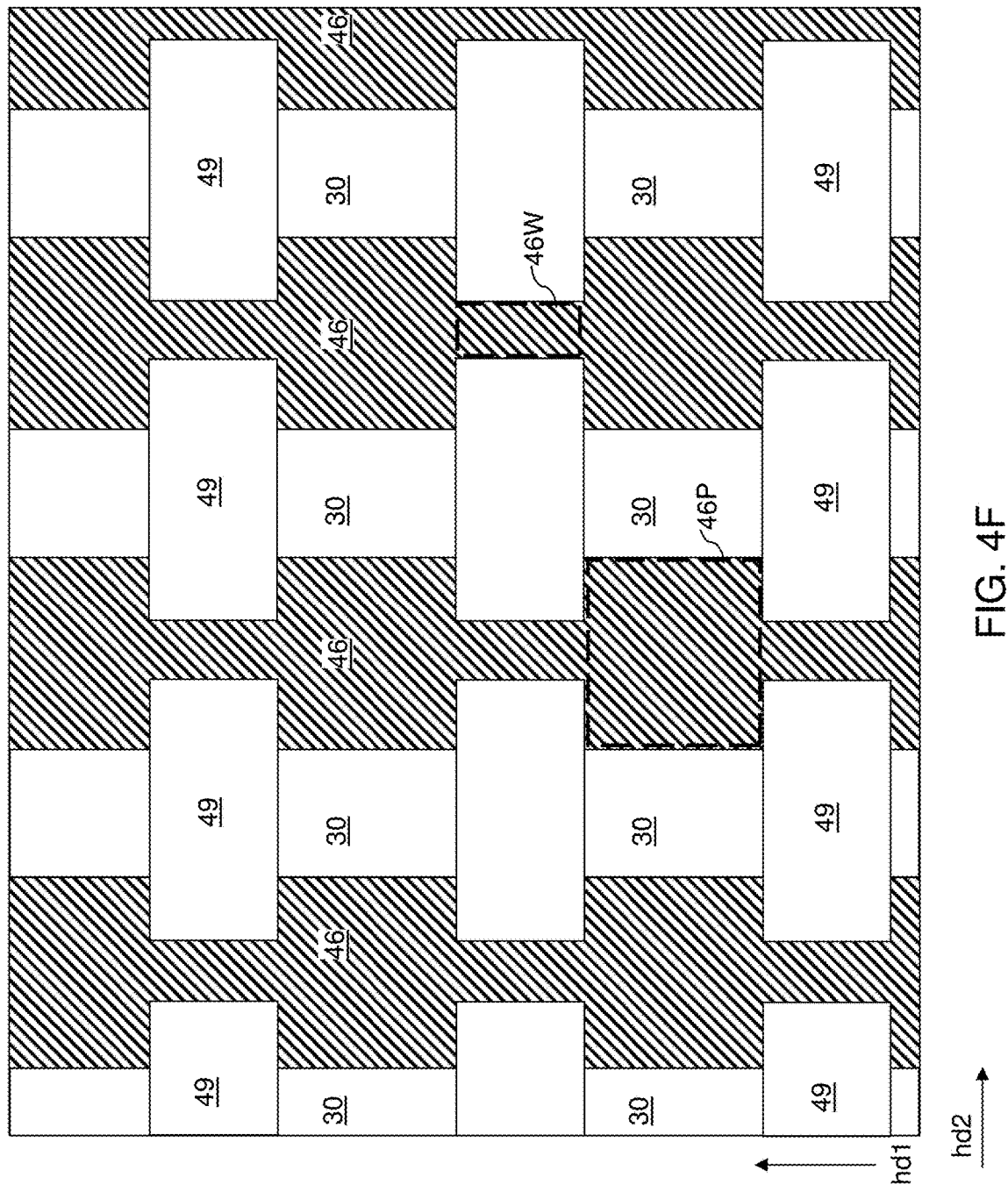
FIG. 4F is a horizontal cross-sectional view of the exemplary structure along a horizontal plane F-F' shown in FIG. 4B.

As shown in FIG. 4F, the anisotropic etch process that forms the two-dimensional array of openings 49 patterns each electrically conductive layer 46 into a laterally alternating plurality of pad portions 46P and wire portions 46W having a lesser width in the second horizontal direction (hd2) than the pad portions 46P. In one embodiment, each opening 49 in the two-dimensional array of openings 49 can have a rectangular horizontal cross-sectional shape with a width along the second horizontal direction hd2 that is greater than the width of the dielectric rail structures 30R along the second horizontal direction hd2. The two-dimensional array of openings 49 can have a spacing along the second horizontal direction hd2, which can be the same as the width of each wire portion 46W of the electrically conductive layers 46. In this case, the width of each opening 49 along the second horizontal direction can be the same as the pitch of the vertically alternating stacks (32, 46) along the second horizontal direction hd2 less the width of wire portions 46W. While rectangular horizontal cross-sectional shapes are illustrated in FIGS. 4A, 4E, and 4F, it is understood that each opening 49 can have rounded corners connected by four straight sidewalls or each opening 49 can have a circular or oval horizontal cross sectional shape. In these cases, the corners of the wire portions 46W and the corners of the pad portions 46P can be rounded or the sidewalls of the wire portions 46W can be concave, respectively.

The pattern of the openings 49 can be selected such that the dielectric rail structures 30R are divided into a two-dimensional array of dielectric pillar structures 30 by the two-dimensional array of openings 49. Each dielectric pillar structure 30 can have a rectangular horizontal cross-sectional shape that is substantially invariant under translation along the vertical direction. Thus, each of the dielectric pillar structures 30 can have a set of four sidewalls that form a rectangle in horizontal cross section, as shown in FIGS. 4A, 4E and 4F. Alternatively, if each opening 49 is not rectangular, then each pillar structure 30 can have curved sidewalls which extend in the second horizontal direction.

Referring to FIGS. 5A-5D, an isotropic selective etch process is performed to isotropically etch the material of the insulating layers 32 selective to the material of the electrically conductive layers 46. For example, if the insulating layers 32 include silicon oxide, a wet etch employing hydrofluoric acid can be performed though the openings 49 to isotropically etch the material of the insulating layers 32 selective to the material of the electrically conductive layers 46. The material of the insulating layers 32 can be isotropically recessed by the isotropic selective etch process at least until the entirety of the material of the insulating layers 32 is etched which is provided between neighboring pairs of openings 49 that are laterally spaced along the second horizontal direction hd2. In other words, the material of the insulating layers 32 is isotropically recessed by a distance that is greater than one half of the spacing of the two-dimensional array of openings 49 along the second horizontal direction hd2.

The isotropic etching of the material of the insulating layers 32 induces merging of each set of openings 49 that are spaced along the second horizontal direction hd2. Each merged set of openings 49 form a line trench 49' that laterally extend along the second horizontal direction hd2. A two-dimensional array of wire portions 46W traverses each line trench 49' along the first horizontal direction hd1, and is suspended between a pair of alternating vertical stacks (32, 46) adjacent to the line trench 49' in which the two-dimensional array of wire portions 46W is suspended. The isotropic selective etch process can be terminated before the entirety of the insulating layers 32 is etched. In case the dielectric pillar structures 30 include the same type of dielectric material as the insulating layers 32 (which can be the case, for example, if the insulating layers 32 and the dielectric pillar structures 30 include silicon oxide), the dielectric pillar structures 30 can be collaterally recessed during the isotropic selective etch process. While the wire portions 46W are shown as having a rectangular vertical cross sectional shape in FIG. 5B, the corners and/or sidewalls of the wire portions 46W may be rounded during the etch process, depending on the selectivity of the etch process. Thus, the wire portions 46W may have any suitable vertical cross sectional shape in the plane extending in the second horizontal direction, including rectangular, circular, oval, etc. vertical cross sectional shape.

After the isotropic selective etch process, top surfaces and bottom surfaces of the wire portions 46W can be physically exposed. Subsets of openings 49 of the two-dimensional array of openings 49 merge along the second horizontal direction hd2 to form a plurality of line trenches 49' that laterally extend along the second horizontal direction hd2 and are laterally spaced apart along the first horizontal direction hd1.

Each insulating layer 32 can be divided into a plurality of insulating portions 32' that are laterally spaced apart along the first horizontal direction hd1. The entire set of insulating portions 32' constitutes a three-dimensional array, which can be a three-dimensional periodic array having a first uniform pitch along the first horizontal direction hd1, a second uniform pitch along the second horizontal direction hd2, and a third uniform pitch along the vertical direction. As shown in FIG. 4A, each insulating layer 32 can also be collaterally recessed in the first horizontal direction hd1, such that portions of the pad portions 46P are exposed between the insulating portions 32'. Thus, end regions of each pad portion 46P of the electrically conductive layers 46 that do not underlie or overlie remaining portions of the insulating portions 32' can be physically exposed to the line trenches 49'.

Referring to FIGS. 6A-6D, a layer stack of a phase change memory material layer 52 and at least one threshold switch material layer 54 can be deposited by a respective conformal deposition process, which can include a respective chemical vapor deposition process and/or a respective atomic layer deposition process. The phase change memory material layer 52 includes a phase change memory material. The at least one threshold switch material layer 54 includes any suitable threshold switch material which exhibits non-linear electrical behavior, such as an ovonic threshold switch material or a diode threshold switch material (e.g., materials for p-n semiconductor diode, p-i-n semiconductor diode, Schottky diode or metal-insulator-metal diode). The layer stack (52, 54) of the phase change memory material layer 52 and the at least one threshold switch material layer 54 can be conformally formed around each wire portion 46W and on edge regions of the pad portions 46P of the electrically conductive layers 46.

As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds, such as $Ge_2Sb_2Te_5$ (GST), germanium antimony (GeSb) compounds, indium germanium telluride (InGeTe) compounds, aluminum selenium telluride (AlSeTe) compounds, indium selenium telluride (InSeTe) compounds, and aluminum indium selenium telluride (AlInSeTe) compounds. These compounds (e.g., compound semiconductor material) may be doped (e.g., nitrogen doped GST) or undoped. Thus, the phase change memory material layer 52 can include, and/or can consist essentially of, a material selected from a germanium antimony telluride compound, a germanium antimony compound, an indium germanium telluride compound, an aluminum selenium telluride compound, an indium selenium telluride compound, a silicon telluride compound, or an aluminum indium selenium telluride compound. The thickness of the phase change memory material layer 52 can be in a range from 1 nm to 20 nm, such as from 2 nm to 10 nm, although lesser and greater thicknesses can also be employed.

As used herein, an ovonic threshold switch (OTS) is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise a chalcogenide material which exhibits hysteresis in both the write and read states. The chalcogenide material may be a germanium telluride (GeTe) compound or a germanium selenide (GeSe) compound doped with a dopant selected from As, N, and C, such as a Ge—Se—As compound semiconductor material. The ovonic threshold switch material layer 54 can include any ovonic threshold switch material. In one embodiment, the ovonic threshold switch material layer 54 can include, and/or can consist essentially of, a germanium selenide arsenide (GeSeAs) alloy, a germanium selenide (GeSe) alloy, a selenium arsenide (SeAs) an alloy, a germanium telluride (GeTe) alloy, or a silicon telluride (SiTe) alloy.

In one embodiment, the material of the ovonic threshold switch material layer 54 can be selected such that the resistivity of the ovonic threshold switch material layer 54 decreases at least by two orders of magnitude (i.e., by more than a factor of 100) upon application of an external bias voltage that exceeds a critical bias voltage magnitude (also referred to as a threshold voltage or $V_t$). In one embodiment, the composition and the thickness of the ovonic threshold switch material layer 54 can be selected such that the critical bias voltage magnitude can be in a range from 1 V to 4 V, although lesser and greater voltages can also be employed for the critical bias voltage magnitude. The thickness of the ovonic threshold switch material layer 54 can be, for example, in a range from 1 nm to 30 nm, such as from 10 nm to 20 nm, although lesser and greater thicknesses can also be employed.

Alternatively, threshold switch material layers 54 can form a diode threshold switch, and can include p-type and n-type semiconductor material layers (e.g., p and n-type silicon) for a p-n diode, or p-type, intrinsic and n-type semiconductor material layers (e.g., p, i and n-type silicon) for a p-i-n diode, semiconductor material which forms a Schottky diode in combination with the material of the wire portions 46W, or a stack of metal, insulator and metal layers for a MIM diode.

Generally, the layer stacks (52, 54) can be formed by conformally depositing the phase change memory material layer 52 in the plurality of line trenches 49' and conformally depositing the at least one threshold switch material layer 54 in the plurality of line trenches 49' prior to, or after, depositing the phase change memory material layer 52. Thus, the phase change memory material layer 52 can be deposited first to wrap around the wire portion 46W and the at least one threshold switch material layer 54 can be deposited second to wrap around the phase change memory material layer 52. Alternatively, the at least one threshold switch material layer 54 can be deposited first to wrap around the wire portion 46W and the phase change memory material layer 52 can be deposited second to wrap around the at least one threshold switch material layer 54.

In another embodiment, an optional barrier layer can be deposited between the phase change memory material layer 52 and the at least one threshold switch material layer 54. The barrier layer can be a carbon barrier layer or another suitable material. Thus, the phase change memory material layer 52 and the at least one threshold switch material layer 54 do not necessarily contact each other. Other barrier or adhesion layers may be formed under and/or over the layer stack (52, 54).

The layer stack (52, 54) can be formed on sidewalls of the dielectric pillar structures 30 that are perpendicular to the first horizontal direction hd1 and on edge regions of top surfaces and bottom surfaces of the pad portions 46P of the electrically conductive layers 46. In one embodiment, the phase change memory material layer 52 can be deposited directly on the electrically conductive layers 46 and directly on the insulating portions 32', and the threshold switch material layer (such as the ovonic threshold switch material layer) 54 can be deposited directly on the phase change memory material layer 52.

The layer stack (52, 54) of the phase change memory material layer 52 and the threshold switch material layer 54 laterally surrounds each of the wire portions 46W of the electrically conductive layers 46. The layer stack (52, 54) includes a three-dimensional array of wrap around portions. Each wrap around portion 5W within the three-dimensional array of wrap around portions 5W surrounds a respective one of the wire portions 46W of the electrically conductive layers 46 and includes a respective phase change memory material wrap around portion and a respective ovonic threshold switch material wrap around portion. In one embodiment, the phase change memory material wrap around portion within a wrap around portion 5W of the layer stack (52, 54) can be located inside the ovonic threshold switch material portion within the wrap around portion 5W.

Figure 7A:
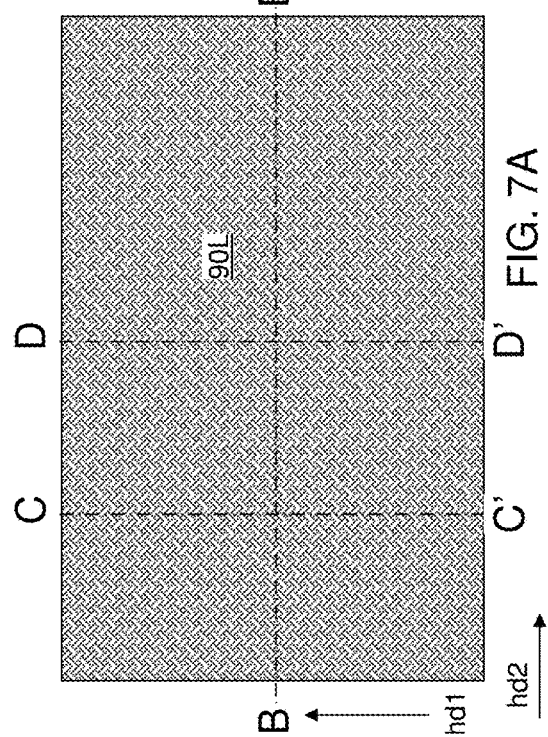
FIG. 7A is a top-down view of the exemplary structure after deposition of a conductive material layer according to an embodiment of the present disclosure.
Figure 7C:
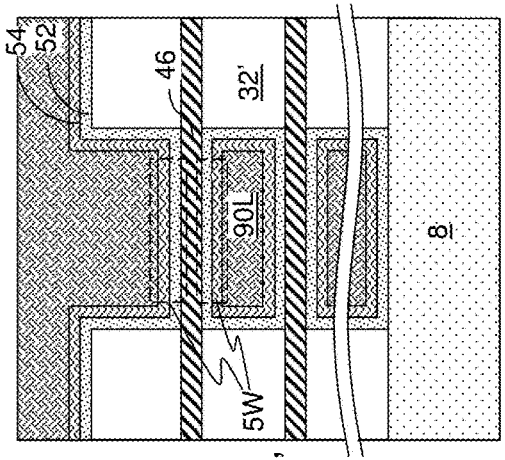
FIG. 7C is a vertical cross-sectional view of the exemplary structure along the vertical plane C-C' of FIG. 7A.
Figure 7B:
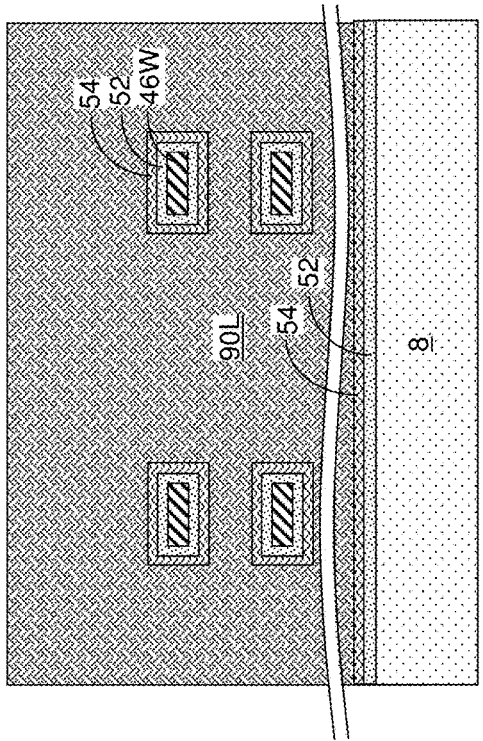
FIG. 7B is a vertical cross-sectional view of the exemplary structure along the vertical plane B-B' of FIG. 7A.
Figure 7D:
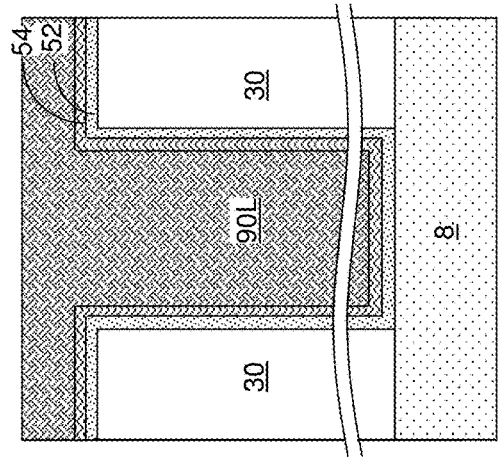
FIG. 7D is a vertical cross-sectional view of the exemplary structure along the vertical plane D-D' of FIG. 7A.

Referring to FIGS. 7A-7C, a conductive material can be deposited in remaining volumes of the line trenches 49' by a conformal deposition process. The conductive material can include a doped semiconductor material (such as polysilicon) and/or a metallic material (such as an elemental metal, an intermetallic alloy, or a conductive metallic compound such as a metal silicide or a metal nitride). For example, the conductive material can be titanium nitride and/or tungsten. The deposited conductive material forms a conductive material layer 90L, which surrounds each wrap around portion 5W of the layer stack (52, 54) of the phase change memory material layer 52 and the threshold switch material layer 54. The conductive material layer 90L can fill each of the line trenches 49' and can overlie each of the dielectric pillar structures 30 and the three-dimensional array of insulating portions 32'.

Referring to FIGS. 8A-8E, a planarization process can be performed to remove portions of the conductive material layer from above the top surfaces of the dielectric pillar structures 30. The planarization process can be performed by chemical mechanical planarization and/or a recess etch. Further, horizontal portions of the phase change memory material layer 52 and the threshold switch material layer 54 that overlie the dielectric pillar structure 30 are also removed by the planarization process. The conductive material layer 90L is divided into multiple discrete portions that are located within a respective one of the line trenches 49'.

Figure 8A:
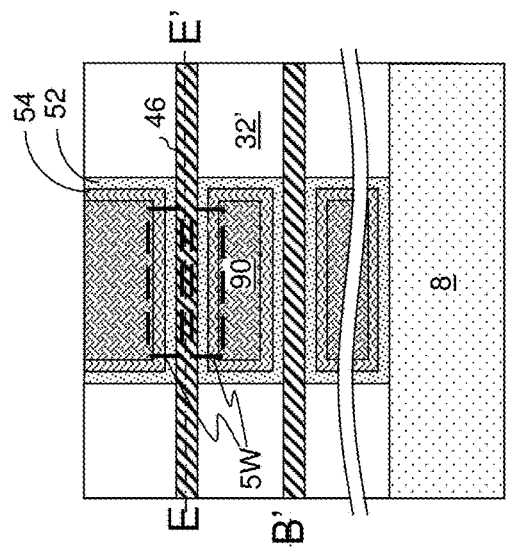
FIG. 8A is a top-down view of the exemplary structure after a plurality of bit lines by removing excess portions of the conductive material layer from above the alternating vertical stack according to an embodiment of the present disclosure.
Figure 8C:
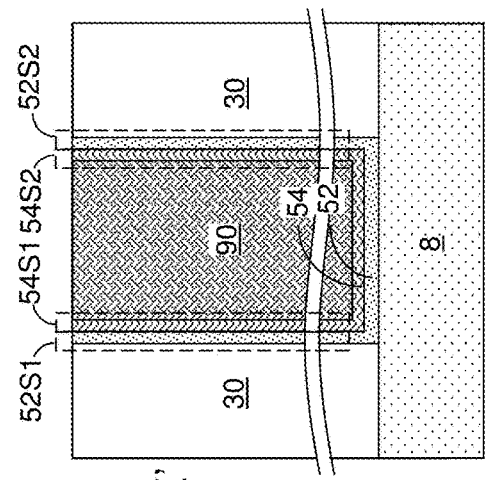
FIG. 8C is a vertical cross-sectional view of the exemplary structure along the vertical plane C-C' of FIG. 8A.
Figure 8B:
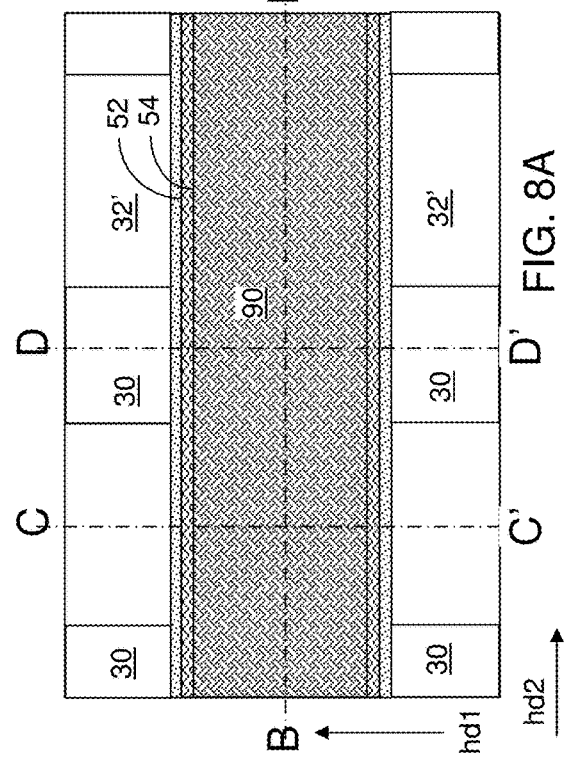
FIG. 8B is a vertical cross-sectional view of the exemplary structure along the vertical plane B-B' of FIG. 8A.

In one embodiment, each of the electrically conductive layers 46 comprises a horizontal word line, while each discrete remaining portion of the conductive material layer 90L constitutes a bit line 90. However, layers 46 may comprise bit lines and lines 90 may comprise word lines. A bit line 90 is a conductive line structure that extends along the second horizontal direction hd2 and laterally surrounds a two-dimensional array of wrap around portions 5W. As shown in FIGS. 8B and 8E, the bit line 90 has vertical portions 90V that extend in the line trenches 49' vertically (i.e., perpendicular to the substrate 8) between the stacks of word lines 46 surrounded by the respective wrap around portions 5W. The phase change memory material layer 52 as provided at the processing steps of FIGS. 6A-6D is divided into multiple discrete phase change memory material layers 52, each of which is located within a respective one of the line trenches 49'. The at least one threshold switch material layer 54 as provided at the processing steps of FIGS. 6A-6D is divided into multiple discrete threshold switch material layers (e.g., discrete ovonic threshold switch material layers) 54, each of which is located within a respective one of the line trenches 49'.

Layer stacks (52, 54) of a phase change memory material layer 52 and at least one threshold switch material layer 54 are formed around the wire portions 46W of the electrically conductive layers 46. Each of the layer stacks (52, 54) includes a respective two-dimensional array of wrap around portions 5W. Each wrap around portion 5W within the respective two-dimensional array of wrap around portions 5W surrounds a respective one of the wire portions 46W of the word lines 46 and includes a respective phase change memory material wrap around portion and a respective threshold switch material wrap around portion, such as an ovonic threshold switch material wrap around portion. Each wrap around portion 5W of the layer stacks (52, 54) is surrounded by a respective one of the plurality of bit lines 90 within a vertical plane that is perpendicular to the first horizontal direction hd1. Each of the plurality of bit lines 90 is formed with a two-dimensional array of openings, such as rectangular openings, therethrough such that a wire portion 46W of an electrically conductive layer 46 and a wrap-around portion 5W of a layer stack (52, 54) extend through each of the rectangular openings. Thus, a two-dimensional array of wire portions 46W extends through each two-dimensional array of openings, such as rectangular or other shaped openings.

An ovonic threshold switch material layer 54 includes a first ovonic threshold switch material sidewall portion 54S1, a second ovonic threshold switch material sidewall portion 54S2, and a two-dimensional array of ovonic threshold switch material wrap around portions connected to the first and second ovonic threshold switch material sidewall portions (54S1, 54S2).

Referring to FIGS. 9A-9D, a first alternative embodiment of the exemplary structure can be derived from the exemplary structure of FIGS. 8A-8E by reversing the order of deposition of the phase change memory material layer 52 and the at least one threshold switch material layer 54 within the layer stack (52, 54) that is formed at the processing steps of FIGS. 6A-6D. In this case, the at least one threshold switch material layer 54 can be deposited directly on the electrically conductive layers (e.g., word lines) 46, and the phase change memory material layer 52 can be deposited directly on the at least one threshold switch material layer 54 during formation of the layer stack (52, 54). Subsequently, the processing steps of FIGS. 7A-7D and 8A-8E can be performed to provide the exemplary structure illustrated in FIGS. 9A-9D.

The first and second phase change memory material sidewall portion (52S1, 52S2) are optional. The first and second ovonic threshold switch material sidewall portions (54S1, 54S2) are also optional. FIGS. 10A-10D illustrate a second alternative embodiment of the exemplary structure, which can be derived from the exemplary structure illustrated in FIGS. 8A-8E by employing at least one selective deposition process to form the layer stack (52, 54) comprising a phase change memory material layer 52 and an ovonic threshold switch material layer 54. In this case, the phase change memory material layer 52 can be deposited employing a selective deposition process that grows a phase change memory material only on surfaces of the electrically conductive layers 46, and does not grow the phase change memory material from dielectric surfaces such as the surfaces of the dielectric pillar structures 30, the insulating portions 32', and insulating top surfaces of the substrate 8. In this case, the phase change memory material layer 52 can be formed as discrete cylindrical phase change memory material portions arranged as a three-dimensional array. The ovonic threshold switch material layer 54 can be deposited by a selective deposition process only on the surfaces of the phase change memory material layer 52 as discrete cylindrical ovonic threshold switch material portions, or can be deposited by a non-selective deposition on a respective two-dimensional array of phase change memory material portions within each line trench. Subsequently, the bit lines 90 can be formed.

FIGS. 11A-11D illustrate a third alternative embodiment of the exemplary structure, which can be derived from the exemplary structure illustrate in FIGS. 9A-9D by employing at least one selective deposition process to form the layer stack (52, 54) comprising an ovonic threshold switch material layer 54 and a phase change memory material layer 52. In this case, the ovonic threshold switch material layer 54 can be deposited employing a selective deposition process that grows an ovonic threshold switch material only on surfaces of the electrically conductive layers 46, and does not grow the ovonic threshold switch material from dielectric surfaces such as the surfaces of the dielectric pillar structures 30, the insulating portions 32', and insulating top surfaces of the substrate 8. In this case, the ovonic threshold switch material layer 54 can be formed as discrete ovonic threshold switch material portions arranged as a three-dimensional array. The phase change memory material layer 52 can be deposited by a selective deposition process only on the surfaces of the ovonic threshold switch material layer 54 as discrete cylindrical phase change memory material portions, or can be deposited by a non-selective deposition on a respective two-dimensional array of ovonic threshold switch material portions within each line trench. Subsequently, the bit lines 90 can be formed.

FIGS. 12A and 12B are schematic illustrations of one memory cell 100 of the phase change memory device described above with respect to FIGS. 1A to 8E. The memory cell 100 includes a first electrode 46 which extends horizontally over the substrate 8 (not shown in FIGS. 12A and 12B for clarity), a layer stack (52, 54) comprising a phase change memory material layer 52 and an ovonic threshold switch material layer 54 which wrap around the first electrode 46. The second electrode 90 contains a first vertical portion 90V1 and a second vertical portion 90V2 which extend vertically and are located on first and second lateral sides of the layer stack (52, 54).

In one embodiment, the first electrode 46 comprises a word line extending in a first horizontal direction hd1 parallel to a top surface of the substrate 8. The second electrode 90 comprises a plate shaped bit line which extends in a vertical plane that is perpendicular to the first horizontal direction hd1. The bit line 90 includes an opening 92 therethrough. The word line 46 and the layer stack (52, 54) are located in the opening 92 such that the bit line 90 surrounds the layer stack (52, 54) on all sides. The current flow path 94 between the word line 46 and the bit line 90 through the layer stack (52, 54) of the memory cell 100 is shown by the dashed lines in FIG. 12B.

Referring collectively to all drawings and according to various embodiments of the present disclosure, a phase change memory device is provided, which comprises: a two-dimensional array of word lines (as embodied as the electrically conductive layers 46) that extend along a first horizontal direction hd1 and including vertical stacks of electrically conductive layers 46 that are laterally spaced apart along a second horizontal direction hd2, wherein each of the electrically conductive layers 46 comprise a laterally alternating plurality of pad portions 46P and wire portions 46W having a lesser width than the pad portions 46P; a plurality of line trenches 49' that laterally extend along the second horizontal direction hd2 and located between a neighboring pair of two-dimensional arrays of pad portions 46P of the electrically conductive layers 46 such that a respective two-dimensional array of wire portions 46W traverses each of the plurality of line trenches 49'; layer stacks (52, 54) of a phase change memory material layer 52 and at least one threshold switch material layer 54 located within a respective one of the plurality of line trenches 49', wherein each of the layer stacks (52, 54) includes a respective two-dimensional array of wrap around portions 5W, and each wrap around portion 5W within the respective two-dimensional array of wrap around portions 5W surrounds a respective one of the wire portions 46W of the electrically conductive layers 46 and includes a respective phase change memory material wrap around portion and a respective threshold switch material wrap around portion; and a plurality of bit lines 90 located within a respective one of the plurality of line trenches 49', wherein each wrap around portion 5W of the layer stacks (52, 54) is surrounded by a respective one of the plurality of bit lines 90 within a vertical plane that is perpendicular to the first horizontal direction hd1.

In one embodiment, the at least one threshold switch material layer 54 comprises an ovonic threshold switch material layer, and the threshold switch material wrap around portion comprises an ovonic threshold switch material wrap around portion.

Figure 8D:
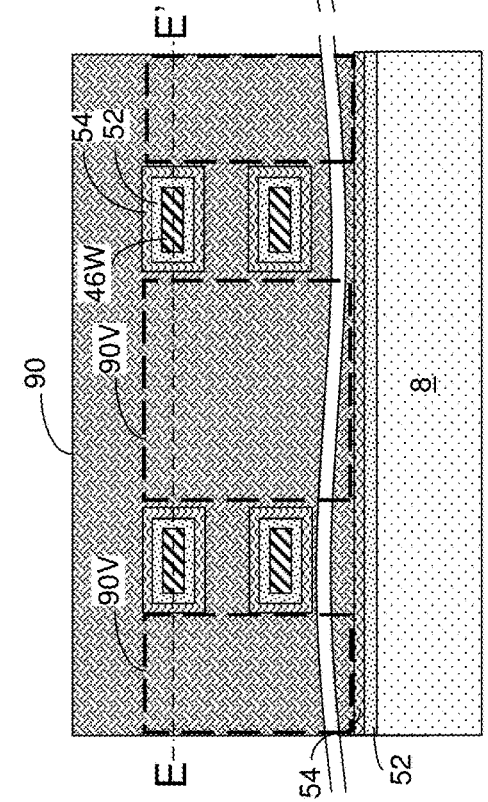
FIG. 8D is a vertical cross-sectional view of the exemplary structure along the vertical plane D-D' of FIG. 8A.
Figure 8E:
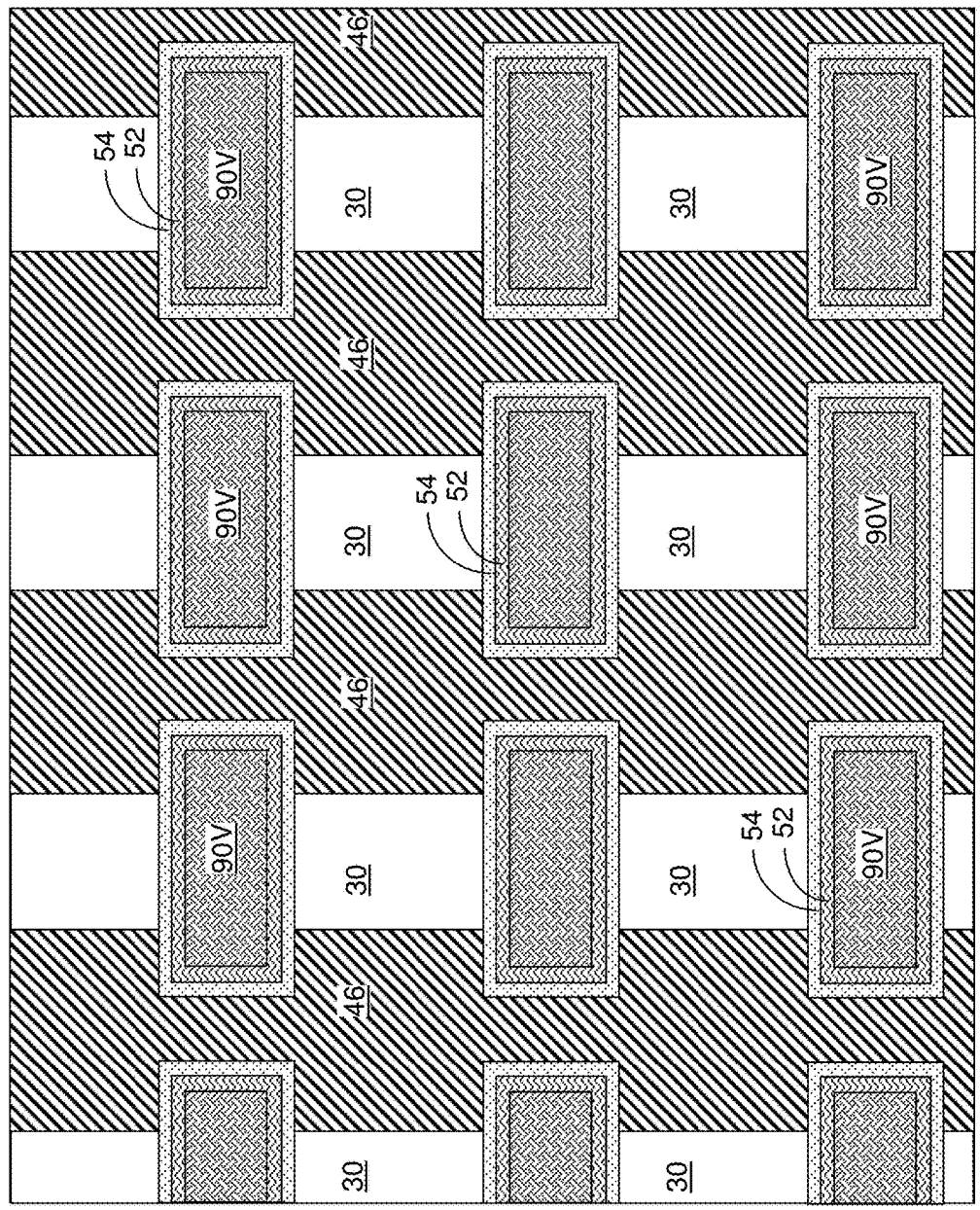
FIG. 8E is a horizontal cross-sectional view of the exemplary structure along the horizontal plane E-E' of FIGS. 8B and 8C.
Figure 9A:
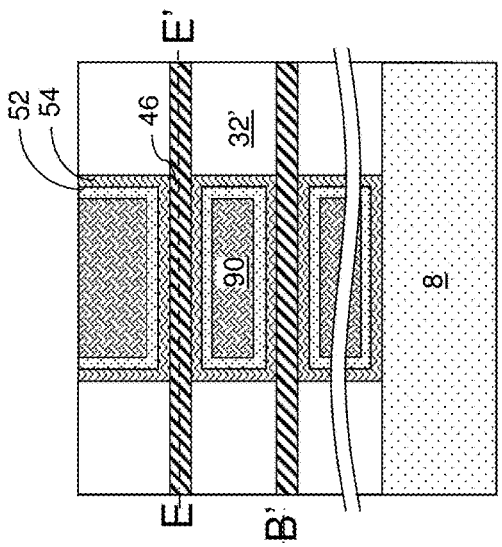
FIG. 9A is a top-down view of a first alternative embodiment of the exemplary structure according to an embodiment of the present disclosure.
Figure 9C:
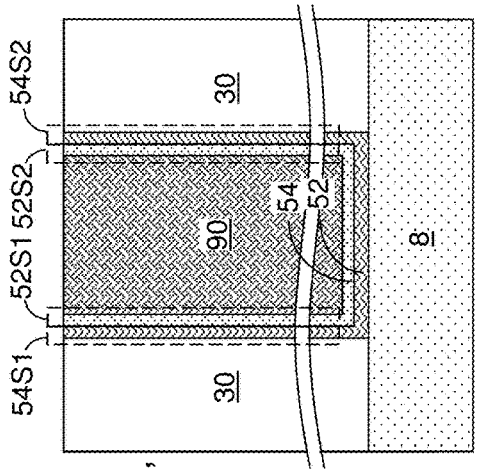
FIG. 9C is a vertical cross-sectional view of the exemplary structure along the vertical plane C-C' of FIG. 9A.
Figure 9B:
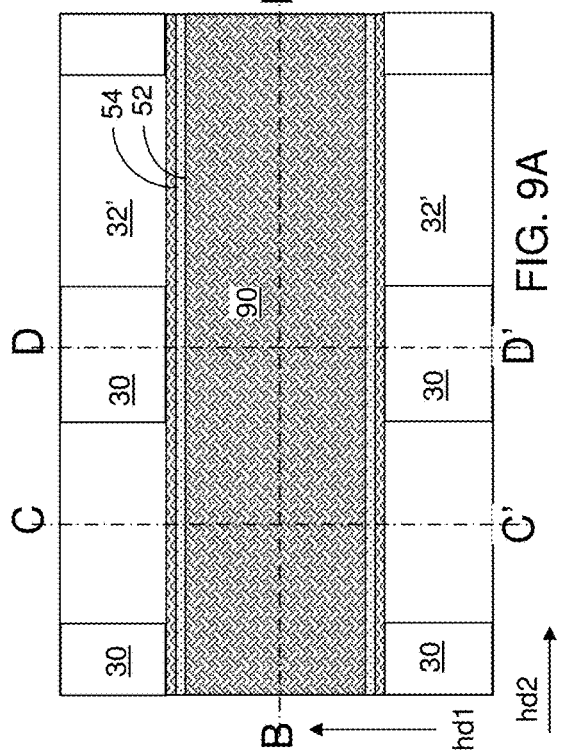
FIG. 9B is a vertical cross-sectional view of the exemplary structure along the vertical plane B-B' of FIG. 9A.
Figure 9D:
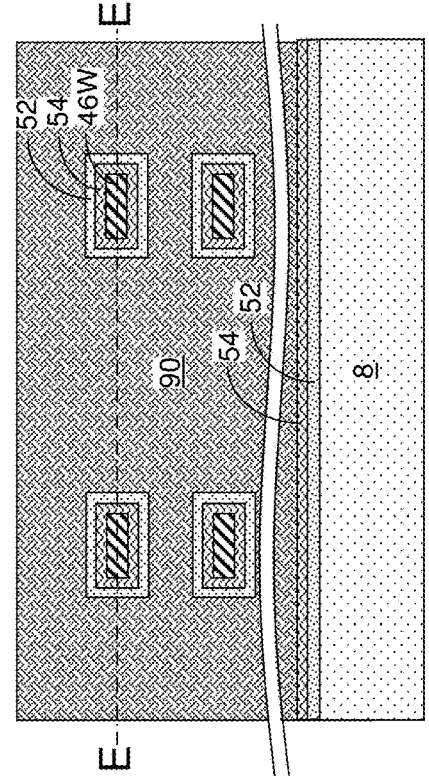
FIG. 9D is a vertical cross-sectional view of the exemplary structure along the vertical plane D-D' of FIG. 9A.
Figure 10A:
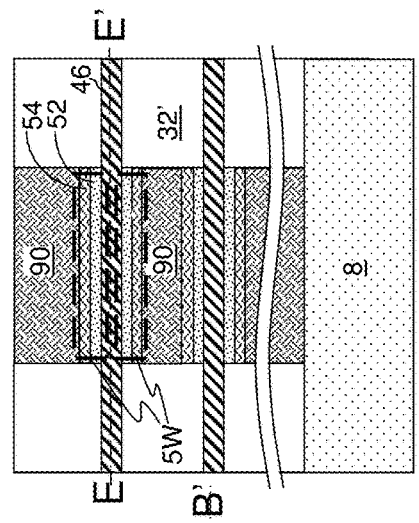
FIG. 10A is a top-down view of a second alternative embodiment of the exemplary structure according to an embodiment of the present disclosure.
Figure 10D:
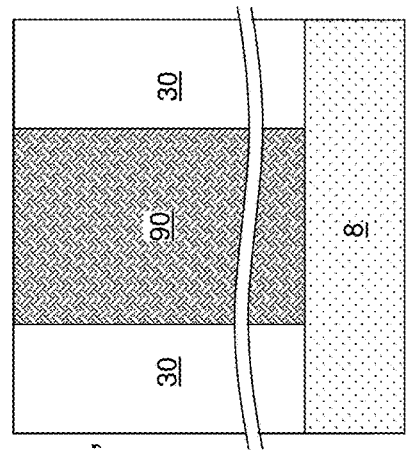
FIG. 10D is a vertical cross-sectional view of the exemplary structure along the vertical plane D-D' of FIG. 10A.
Figure 10B:
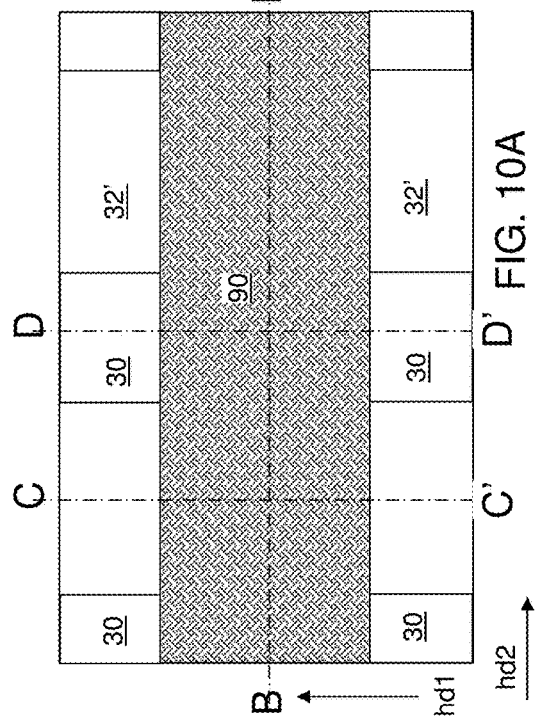
FIG. 10B is a vertical cross-sectional view of the exemplary structure along the vertical plane B-B' of FIG. 10A.
Figure 10C:
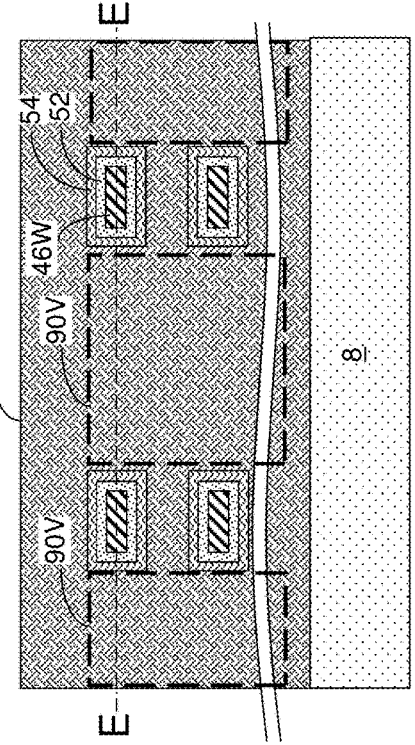
FIG. 10C is a vertical cross-sectional view of the exemplary structure along the vertical plane C-C' of FIG. 10A.

In one embodiment shown in FIGS. 8D and 9D, each of the layer stacks (52, 54) comprises: a phase change memory material layer 52 that includes a first phase change memory material sidewall portion 52S1 that is perpendicular to the first horizontal direction hd1, a second phase change memory material sidewall portion 52S2 that is perpendicular to the first horizontal direction hd1, and a two-dimensional array of phase change memory material wrap around portions connected to the first and second phase change memory material sidewall portions (52S1, 52S2); and an ovonic threshold switch material layer 54 that includes a first ovonic threshold switch material sidewall portion 54S1, a second ovonic threshold switch material sidewall portion 54S2, and a two-dimensional array of ovonic threshold switch material wrap around portions connected to the first and second ovonic threshold switch material sidewall portions (54S1, 54S2).

In some embodiments, the phase change memory material layer 52 of each layer stack (52, 54) directly contacts the electrically conductive layers 46. In some other embodiments, the phase change memory material layer 52 of each layer stack (52, 54) directly contacts a respective one of the plurality of bit lines 90.

In some embodiments, each of the plurality of line trenches 49' can have a respective width (which may be uniform) along the first horizontal direction hd1 that is greater than a length along the first horizontal direction hd1 of each wire portion 46W located therein. The differences between the width of a line trench 49' and the length of wire portions 46W therein can be twice the recess distance of the selective isotropic etch process. In some embodiments, each pad portion 46P within a two-dimensional array of pad portions 46P located between a neighboring pair of line trenches 49' has a length along the first horizontal direction hd1 that is greater than a lateral separation distance between the neighboring pair of line trenches 49' along the first horizontal direction hd1. The difference between the length of pad portions 46P between a pair of line trenches 49' and the lateral separation distance between the pair of line trenches 49' can be twice the recess distance of the selective isotropic etch process.

In one embodiment, a two-dimensional array of dielectric pillar structures 30 can be located between each neighboring pair of vertical stacks of pad portions 46P of the electrically conductive layers 46 that are spaced apart along the second horizontal direction hd2. Each dielectric pillar structure 30 within the two-dimensional array of dielectric pillar structures 30 can contact a respective one of the layer stacks (52, 54).

In one embodiment, interfaces between the pad portions 46P and the wire portions 46W of the electrically conductive layers 46 can be laterally offset along the first horizontal direction hd1 from sidewalls of the plurality of line trenches 49', and can be located within a volume of a respective one of the plurality of line trenches 49'. The lateral offset distance can be the same as the recess distance of the selective isotropic etch process.

In one embodiment, each of the wire portions 46W can have a rectangular vertical cross-sectional shape within a respective vertical plane that is perpendicular to the first horizontal direction hd1.

In one embodiment, the phase change memory material wrap around portions comprise a material selected from a germanium antimony telluride compound, a germanium antimony compound, an indium germanium telluride compound, an aluminum selenium telluride compound, an indium selenium telluride compound, and an aluminum indium selenium telluride compound, and the ovonic threshold switch material wrap around portions comprise a GeSeAs alloy, a GeSe alloy, an SeAs alloy, a GeTe alloy, or an SiTe alloy.

In one embodiment, each of the plurality of bit lines 90 includes a two-dimensional array of rectangular openings 92 therethrough, and a two-dimensional array of wire portions 46W extends through each two-dimensional array of rectangular openings 92. In one embodiment, an electrical system contains a storage device comprising at least one phase change memory device described above and a selector device to electrically access a plurality of memory cells in the phase change memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A phase change memory device, comprising:
  word lines comprising electrically conductive layers that extend along a first horizontal direction and are laterally spaced apart along vertical direction and along a second horizontal direction, wherein each of the electrically conductive layers comprises a laterally alternating plurality of pad portions and wire portions having a lesser width than the pad portions in the second horizontal direction;
  a plurality of line trenches that laterally extend along the second horizontal direction and located vertically between neighboring pairs of pad portions of the electrically conductive layers, wherein an array of wire portions traverses each of the plurality of line trenches along the first horizontal direction;
  layer stacks of a phase change memory material layer and at least one threshold switch material layer, wherein each layer stack is wrapped around a corresponding wire portion of the electrically conductive layers located within one of the plurality of line trenches, the plurality of layer stacks creating a two-dimensional array of wrap around portions; and
  a plurality of bit lines located within a respective one of the plurality of line trenches, wherein each wrap around portion of the layer stacks is surrounded by a respective one of the plurality of bit lines within a vertical plane that is perpendicular to the first horizontal direction.

2. The phase change memory device of claim 1, wherein:
each of the plurality of bit lines includes a two-dimensional array of rectangular openings therethrough; and
a two-dimensional array of wire portions extends through each two-dimensional array of rectangular openings.

3. The phase change memory device of claim 1, wherein:
the electrically conductive layers comprise horizontal word lines;
the at least one threshold switch material layer comprises an ovonic threshold switch material; and
each threshold switch material wrap around portion comprises an ovonic threshold switch material wrap around portion.

4. The phase change memory device of claim 3, wherein each of the layer stacks comprises:
a phase change memory material layer that includes a first phase change memory material sidewall portion that is perpendicular to the first horizontal direction, a second phase change memory material sidewall portion that is perpendicular to the first horizontal direction, and a two-dimensional array of phase change memory material wrap around portions connected to the first and second phase change memory material sidewall portions; and
an ovonic threshold switch material layer that includes a first ovonic threshold switch material sidewall portion, a second ovonic threshold switch material sidewall portion, and a two-dimensional array of ovonic threshold switch material wrap around portions connected to the first and second ovonic threshold switch material sidewall portions.

5. The phase change memory device of claim 4, wherein the phase change memory material layer of each layer stack directly contacts the electrically conductive layers, or the phase change memory material layer of each layer stack directly contacts a respective one of the plurality of bit lines.

6. The phase change memory device of claim 3, wherein:
each of the plurality of line trenches has a respective width along the first horizontal direction that is greater than a length along the first horizontal direction of each wire portion located therein; and
each pad portion located between a neighboring pair of line trenches has a length along the first horizontal direction that is greater than a lateral separation distance between the neighboring pair of line trenches along the first horizontal direction.

7. The phase change memory device of claim 3, further comprising dielectric pillar structures located between each neighboring pair of pad portions of the electrically conductive layers that are spaced apart along the vertical direction and along the second horizontal direction, wherein each dielectric pillar structure contacts a respective one of the layer stacks.

8. The phase change memory device of claim 3, wherein:
interfaces between the pad portions and the wire portions of the electrically conductive layers are laterally offset along the first horizontal direction from sidewalls of the plurality of line trenches and are located within a volume of a respective one of the plurality of line trenches;
each of the wire portions has a rectangular vertical cross-sectional shape within a respective vertical plane that is perpendicular to the first horizontal direction;
the phase change memory material wrap around portions comprise a material selected from a germanium antimony telluride (GeSbTe) compound, a germanium antimony (GeSb) compound, an indium germanium telluride (InGeTe) compound, an aluminum selenium telluride compound, an indium selenium telluride compound, and an aluminum indium selenium telluride (AlInSeTe) compound; and
the ovonic threshold switch material wrap around portions comprise a germanium selenide arsenide (GeSeAs) compound, a germanium selenide (GeSe) compound, a selenium arsenide an (SeAs) compound, a germanium telluride (GeTe) compound, or a silicon telluride an (SiTe) compound.

* * * * *